United States Patent
Shimizu et al.

(10) Patent No.: US 8,446,724 B2
(45) Date of Patent: May 21, 2013

(54) ELECTRIC CONNECTION BOX

(75) Inventors: Tatsuya Shimizu, Yokkaichi (JP); Manabu Hashikura, Yokkaichi (JP)

(73) Assignees: Autonetworks Technologies, Ltd., Mic (JP); Sumitomo Wiring Systems, Ltd., Mic (JP); Sumitomo Electric Industries, Ltd., Osaka (JP)

( * ) Notice: Subject to any disclaimer, the term of this patent is extended or adjusted under 35 U.S.C. 154(b) by 542 days.

(21) Appl. No.: 12/452,612

(22) PCT Filed: Jul. 25, 2008

(86) PCT No.: PCT/JP2008/063382
§ 371 (c)(1),
(2), (4) Date: Jan. 12, 2010

(87) PCT Pub. No.: WO2009/017046
PCT Pub. Date: Feb. 5, 2009

(65) Prior Publication Data
US 2010/0134975 A1    Jun. 3, 2010

(30) Foreign Application Priority Data
Aug. 1, 2007   (JP) .................................. 2007-200719

(51) Int. Cl.
*H05K 7/20*   (2006.01)
(52) U.S. Cl.
USPC ...... 361/694; 361/688; 361/690; 361/679.49; 361/679.5; 361/704
(58) Field of Classification Search
USPC ................. 361/688, 690, 679.49, 679.5, 703, 361/704, 679.46–679.54
See application file for complete search history.

(56) References Cited

U.S. PATENT DOCUMENTS 6,034,870 A  *   3/2000  Osborn et al. ................ 361/690
6,144,556 A  *  11/2000  Lanclos ........................ 361/695
6,911,598 B2 *   6/2005  Onizuka et al. ................ 174/50

FOREIGN PATENT DOCUMENTS

| JP | U-59-084885 | 6/1984 |
| JP | A-08-130817 | 5/1996 |
| JP | A-9-191191 | 7/1997 |
| JP | A-2002-305827 | 10/2002 |
| JP | A-2005-303195 | 10/2005 |

OTHER PUBLICATIONS

Feb. 16, 2012 Office Action issued in Japanese Patent Application No. 2007-200719 (with English-language translation).
International Search Report issued in International Application No. PCT/JP2008/063382 on Aug. 19, 2008 (with English-language translation).

* cited by examiner

*Primary Examiner* — Tuan T Dinh
*Assistant Examiner* — Hung Dang
(74) *Attorney, Agent, or Firm* — Oliff & Berridge, PLC

(57) ABSTRACT

In an electric connection box, a heat insulation wall is vertically extended in a case. This forms, between the heat insulation wall and the inner wall of the case, an ascending flow path where air can ascend and a descending flow path where air can descend. An upper communication opening and a lower communication opening that connect between the ascending flow path and the descending flow path are arranged at the upper end and the lower end, respectively, of the heat insulation wall. A relay is placed in the ascending flow path. Among the regions of the case, a region forming the descending flow path is provided with a heat radiation wall section for releasing heat of air in the descending flow path to the outside of the case.

16 Claims, 12 Drawing Sheets

ELECTRIC CONNECTION BOX

TECHNICAL FIELD

The present invention relates to an electric connection box.

BACKGROUND ART

Patent Literature 1 has been well-known as a conventional electric connection box. This electric connection box is constituted by housing a circuit board in a case. An electronic component such as a relay is mounted in this circuit board. Energizing the electronic component causes heat to be generated. According to the electric connection box disclosed in Patent literature 1, heat generated from the electronic component would be diffused out of the case from an opening provided in the case.

With the opening provided in the case, dust intrusion from this opening into the case might cause a short-circuit between the electronic components. The electric connection box disclosed in the Patent literature 1 intends to prevent the dust intrusion by providing a louver in the opening. However, the louver cannot completely prevent the dust intrusion.

Considering the foregoing, the circuit board may be sealed in the case, without providing an opening in the case. However, according to the above configuration, heat generated from the electronic components remains inside of the case, and might cause a local and large temperature rise inside of the case. If so, for example, the temperature in a soldered part between the electronic component and the circuit board rises above the soldering heat-resistant temperature, and might degrade the connection reliability between the electronic component and the circuit board.

[Patent literature 1]: Japanese Unexamined Patent Publication No. H08-130817

The present invention has been made on the basis of the above circumstances, with an object of providing an electric connection box which is constituted so as to suppress a local and large temperature rise therein.

SUMMARY

The present invention relates to an electric connection box, comprising: a case, a heating component housed in the case, and a heat insulation wall extended vertically in the case, wherein, in the case, between the heat insulation wall and the case, an ascending flow path where air can ascend and a descending flow path where air can descend are provided, and an upper communication opening and a lower communication opening that connect between the ascending flow path and the descending flow path are arranged at the upper end and the lower end, respectively, of the heat insulation wall, and the heating component is placed inside of the ascending flow path, and the case is capable of releasing heat of the air therein to the outside of the case.

Heat generated from the heating component is transmitted to the air surrounding the heating component. Then, the temperature rise of the air causes the specific gravity of the air to be lowered, and the air therefore ascends in the ascending flow path. Then, with the air surrounding the ascending air caught in, an ascending air current occurs in the ascending flow path. The air that has reached the upper end of the ascending flow path then moves into the descending flow path through the upper communication opening. The case is capable of releasing heat of the air therein to the outside of the case, and thus, heat of the air in the descending flow path is then released to the outside of the case through the case. Then, the temperature fall of the air in the descending flow path causes the specific gravity of the air to be enlarged, and the air therefore descends in the descending flow path. Then, with the air surrounding the descending air caught in, a descending air current occurs in the descending flow path. The air that has reached the lower end of the descending flow path then moves into the ascending flow path through the lower communication opening. The temperature of, the air flown in the ascending flow path is lowered by the heat release through the case to the outside of the case. The air with its temperature lowered in such manner then absorbs heat of the heating component in the ascending flow path, and thereby ascends again.

As mentioned, according to the present invention, a natural air convection occurs in the case in a path sequentially following: the heating component, the ascending flow path, the upper communication opening, the descending flow path, the lower communication opening, the heating component, and the ascending flow path. Accordingly, the air circulating in the case allows heat generated from the heating component to be dispersed inside of the case. And, as a result, a large and local temperature rise in the case can be suppressed.

The present invention can suppress a large and local temperature rise in the case in the electric connection box.

DESCRIPTION OF SYMBOLS

Figure 1:
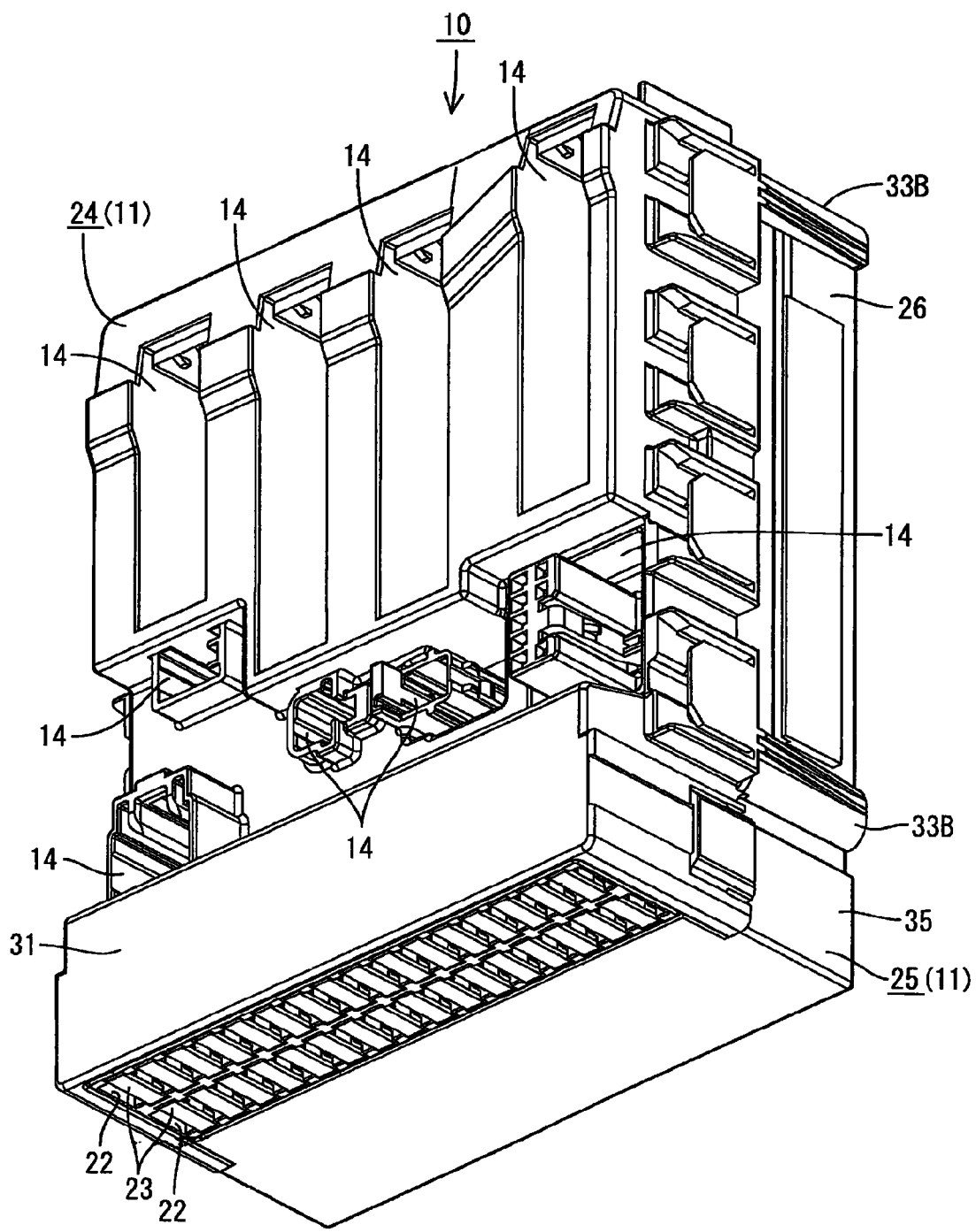
FIG. 1 is an overall perspective view of an electric connection box according to Embodiment 1.
Figure 2:
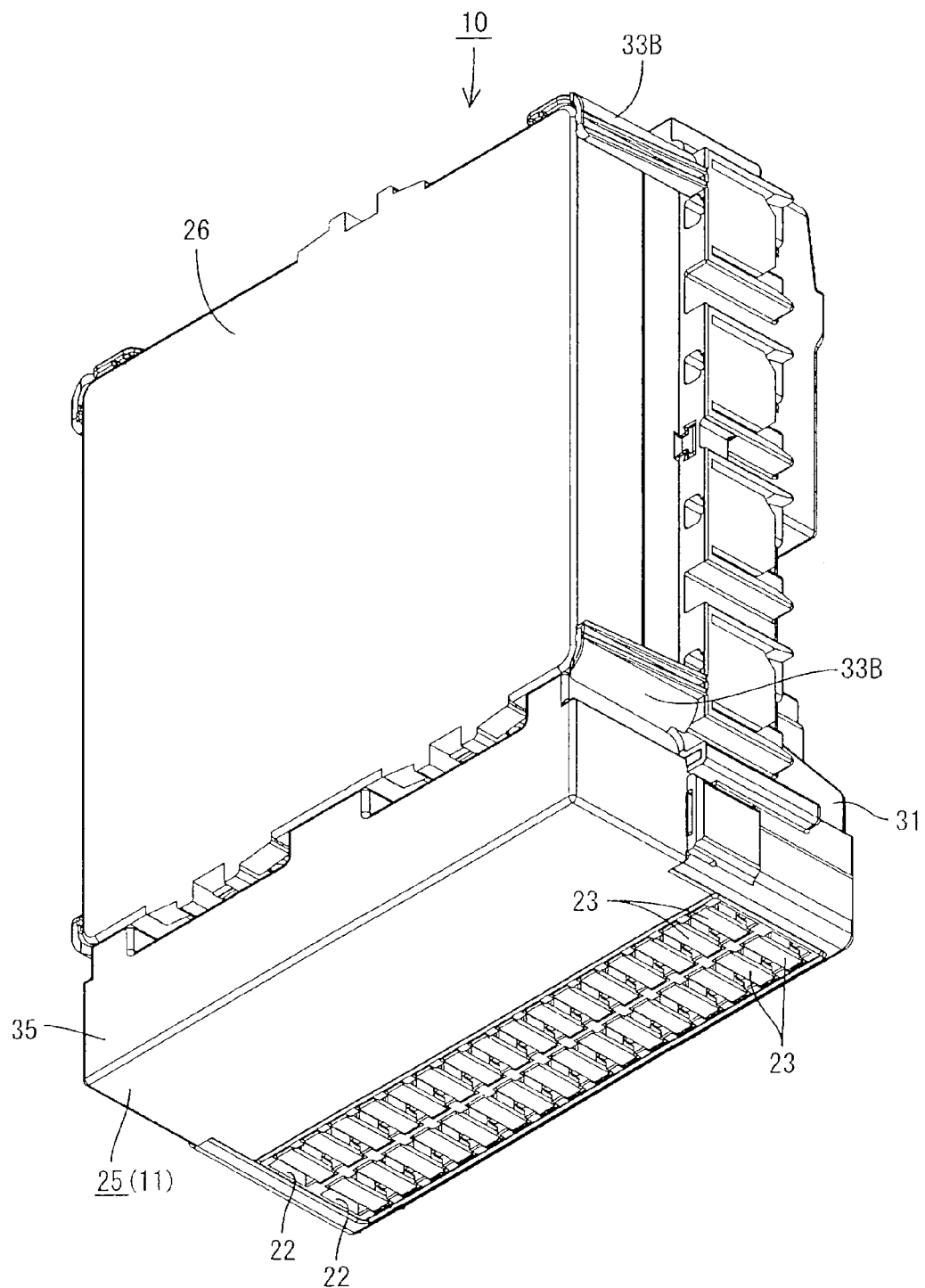
FIG. 2 is an overall perspective view of the electric connection box viewed from a different perspective from FIG. 1.

10 ... electric connection box
11 ... case
12 ... circuit board
23 ... fuse (heating component)
24 ... case body (case)
25 ... cover (case)
34A, 34B, 34C ... relay (heating component)
50 ... resistance (electronic component)
51 ... substrate mounting relay (electronic component)
53 ... heat insulation wall
54 ... ascending flow path
55 ... descending flow path
56 ... upper communication opening
57 ... lower communication opening
58A ... heat radiation wall section
58B ... heat radiation wall section
58C ... heat radiation wall section 59 . . . first wall
60 . . . second wall
61 . . . air layer
70 . . . heat radiation member

BEST MODE FOR CARRYING OUT THE
INVENTION

<Embodiment 1>

Figure 3:
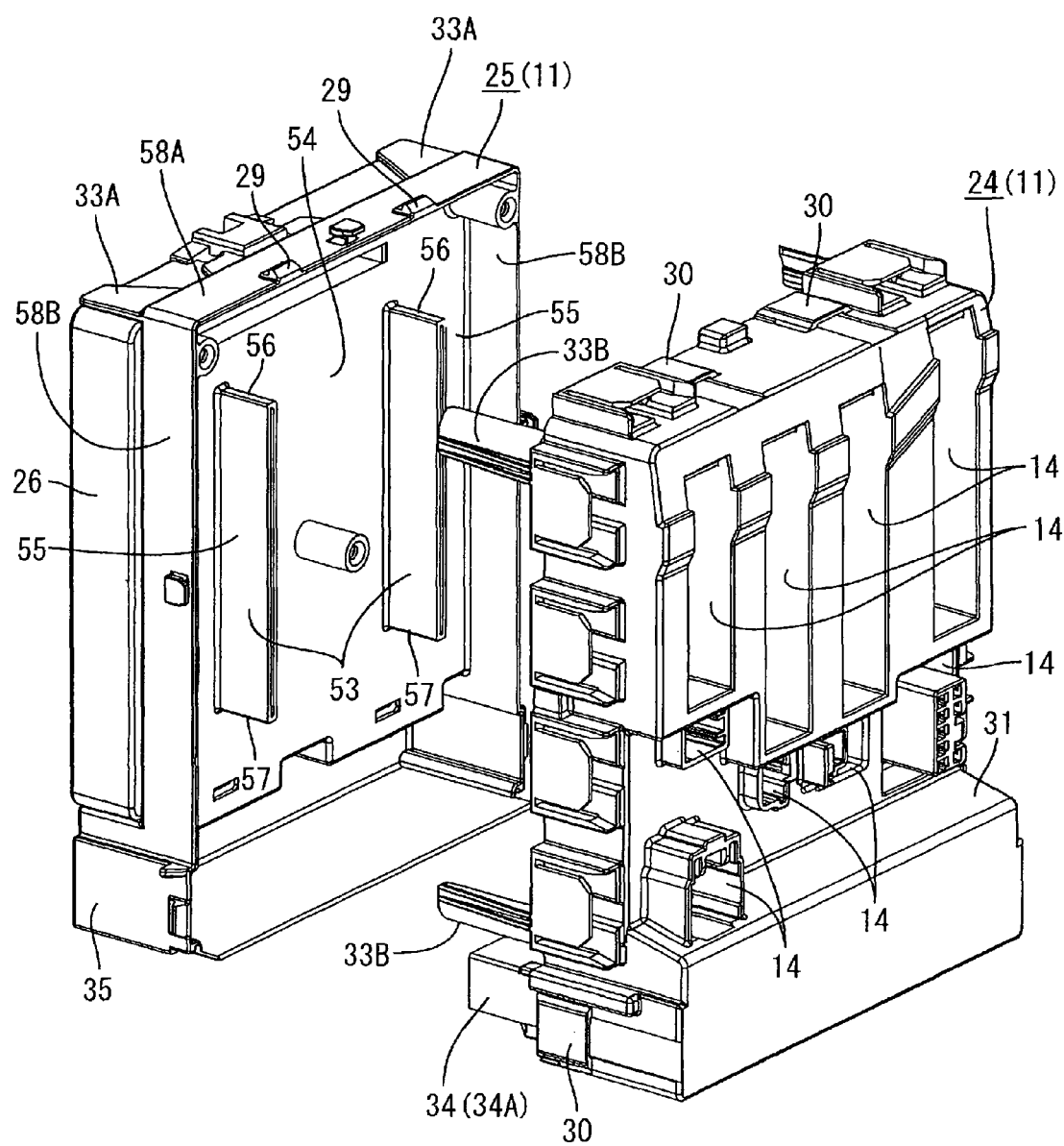
FIG. 3 is an exploded perspective view of a part of the electric connection box.
Figure 4:
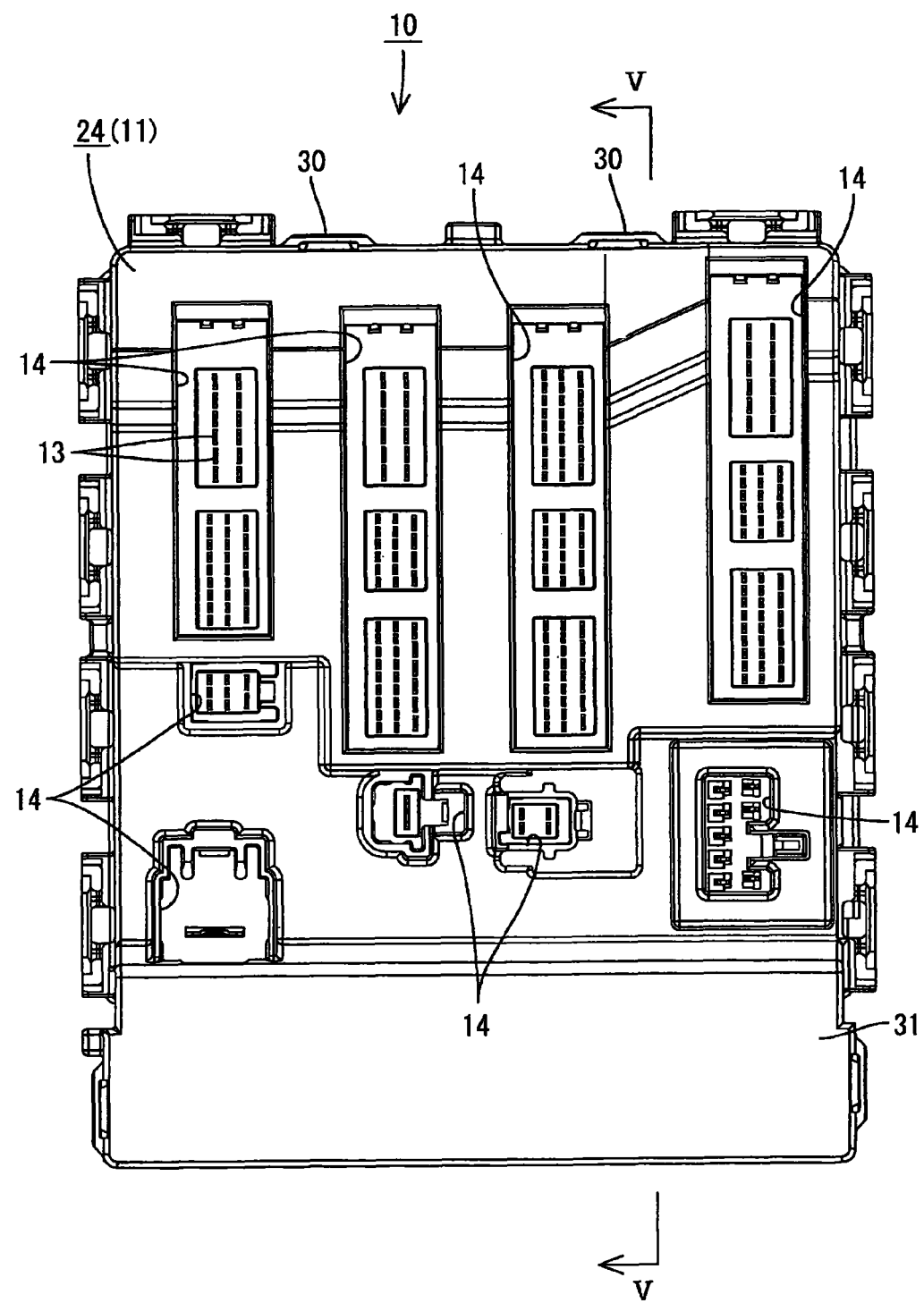
FIG. 4 is an elevation view of the electric connection box.
Figure 5:
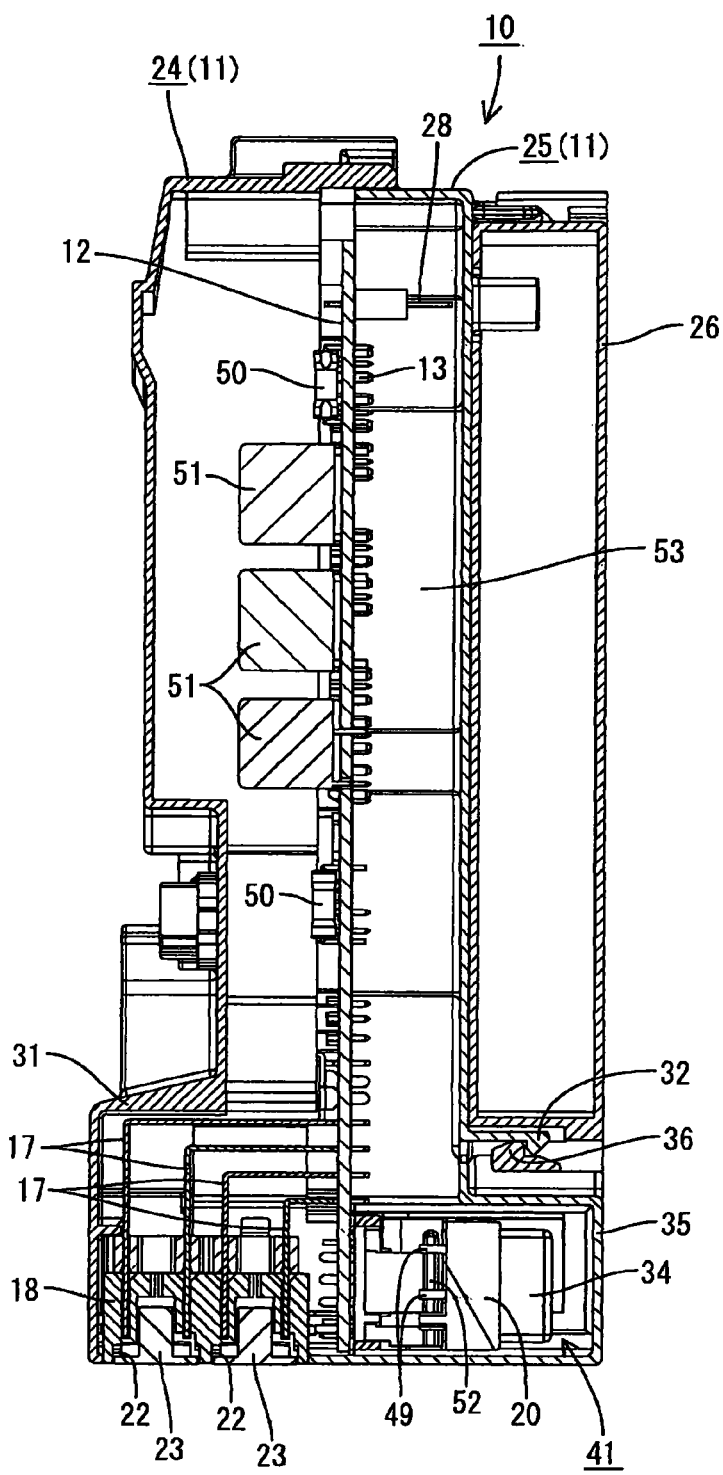
FIG. 5 is a cross-sectional view taken along a line V-V in FIG. 4.
Figure 6:
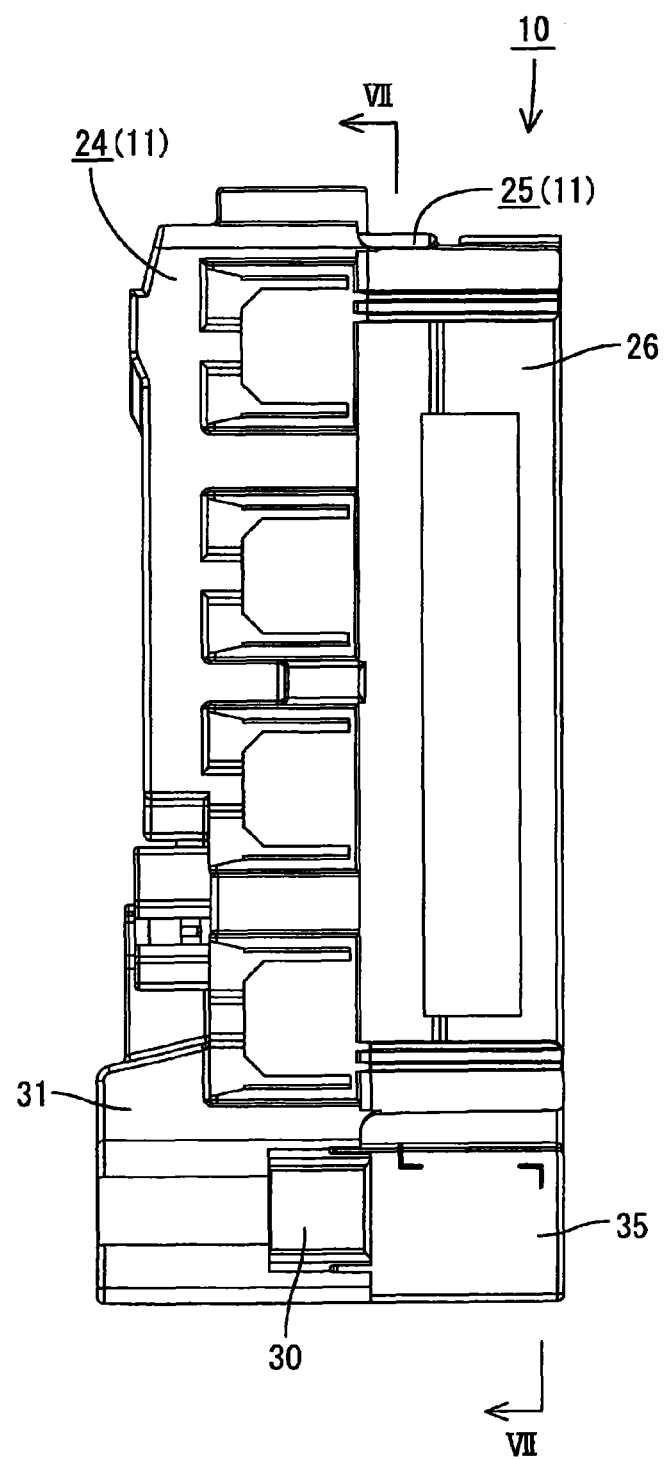
FIG. 6 is a side view of the electric connection box.

In reference to FIGS. 1 to 7, Embodiment 1 of the present invention is described. An electric connection box 10 in the present embodiment is mounted in a vehicle not shown for its use. The electric connection box 10 is assembled between a battery (not shown) and vehicle electrical components such as a lamp and power window (not shown), and controls the energizing and de-energizing of these vehicle electrical components. The electric connection box 10 is constituted by housing a circuit board 12 in a flat case 11 (see FIGS. 5 and 7). The electric connection box 10 is assembled in, for example, a vehicle cabin in an upright posture as shown in FIG. 5, in other words, in a posture so that the plate face of the circuit board 12 stands perpendicularly.

Figure 7:
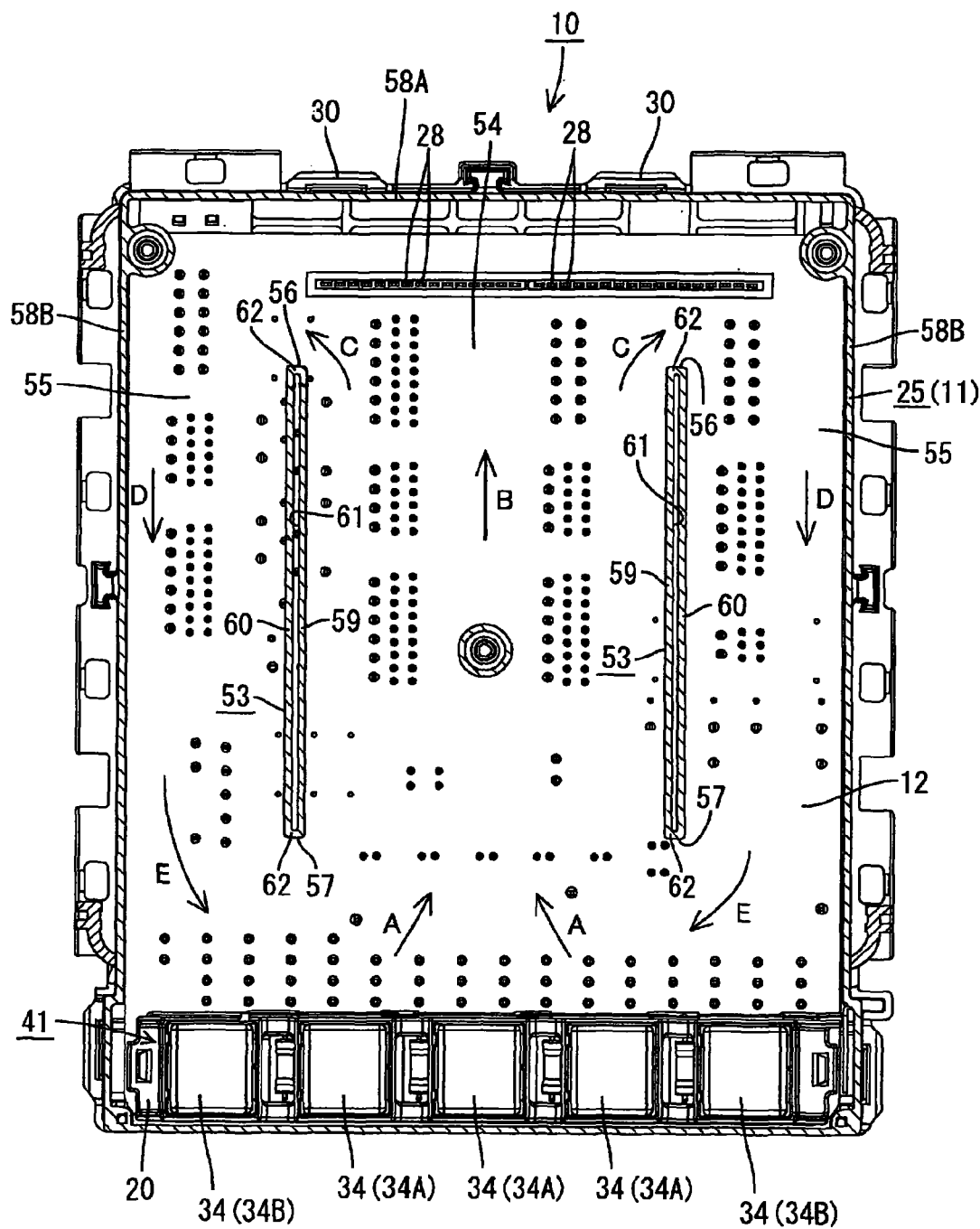
FIG. 7 is a cross-sectional view taken along a line VII-VII in FIG. 6.

As shown in FIG. 7, the circuit board 12 forms a nearly rectangular shape, and a conductive path (not shown) is formed on its surface by means of the printed wiring technology. As shown in FIGS. 4 and 5, a male tab 13 as a connector for the connection with an external circuit is connected with the circuit board 12. The male tab 13 is positioned inside of the later-described connector housing member 14 (see FIG. 4).

And also, a resistance 50 (an example of electronic components) and a substrate mounting relay 51 (an example of electronic components) are mounted in the circuit board 12.

As shown in FIG. 5, at the position close to the lower end of the circuit board 12, one ends of a plurality of fuse terminals 17 penetrate the circuit board 12 from the right to the left direction in FIG. 5. One ends of the fuse terminals 17 are soldered to the circuit board 12. The other ends of the fuse terminals 17 are bent downwardly into a nearly L shape and attached to the later-described fuse block 18.

As shown in FIG. 5, the fuse block 18 is made of synthetic resin and having a substantially rectangular parallelepiped shape. Formed on the bottom surface of the fuse block 18 in FIG. 5 is a fuse attaching member 22 which is recessed upwardly. The fuse terminal 17 is positioned inside of this fuse attaching member 22. A fuse 23 is attached inside of the fuse attaching member 22, and connected with the fuse terminal 17. As shown in FIG. 1, the fuse attaching members 22 are aligned obliquely from the lower left to the upper right in FIG. 1, while being aligned obliquely from the upper left to the lower right in FIG. 1 (in the present embodiment, in two stages).

As shown in FIG. 5, the case 11 forms a shape of shallow container made of synthetic resin, and comprises a flat case body 24 for housing the circuit board 12 therein and a cover 25 made of synthetic resin and for covering the opening surface of the case body 24. An ECU 26 is attached to the cover 25 on a surface located on the opposite side of the case body 24 (see FIG. 2). In the present embodiment, the case 11 is not provided with an opening that introduces external air into the case 11.

The ECU 26 is constituted by housing an ECU substrate not shown inside thereof. The ECU substrate and the circuit board 12 are connected through an ECU connecting terminal 28. The ECU connecting terminal 28 is connected with the circuit board 12 at a position closer to the upper end of the circuit board 12 in FIG. 5.

As shown in FIG. 3, provided on the upper and side surfaces of the case body 24 are a plurality of lock receivers 30 to be elastically fitted with a plurality of lock protrusions 29 provided on the upper and side surfaces of the cover 25, and fitting these lock receivers 30 with the lock protrusions 29 allows the case body 24 and the cover 25 to be integrated.

The lower end of the case body 24 is bulged out to the left in FIG. 5, and thus forms a fuse housing member 31 for housing the above-mentioned fuse block 18. The lower end of the fuse housing member 31 is opening downwardly, and the fuse block 18 is attached in this opening. As shown in FIG. 5, the lower opening edge of the fuse-housing member 31 and the outer surface of the bottom of the fuse block 18 are nearly flush with each other.

A plurality of connector housing members 14 for attaching connectors not shown are provided on the wall surface of the case body 24 in the front side of the page of FIG. 4, by being recessed in the depth direction of the page. The male tab 13 is positioned inside of the connector housing member 14.

The cover 25 is, as shown in FIG. 3, forming nearly a shallow plate shape and attached to the case body 24 so as to cover its opening surface. As shown in FIG. 3, the lock protrusion 29 to be engaged with the lock receiver 30 in the case body 24 is formed on the upper and side walls of the cover 25. In addition, as shown in FIG. 5, a lock 32 protruding to the side of the ECU 26 and capable of elastic flexure is formed on the wall surface of the cover 25 that is opposed to the ECU 26, and elastically engages with a receiving portion 36 formed in the ECU 26, and thereby integrating the cover 25 and the ECU 26.

Then, as shown in FIG. 3, a plate-like guide 33A protruding to the side of the ECU 26 is formed on the wall surface of the cover 25 that is opposed to the ECU 26. When fitting the cover 25 and the ECU 26, abrading contact between the guide 33A and the outer side surface of the ECU 26 allows the ECU 26 to be guided to a prescribed fitting position. Moreover, four guides 33B extending toward the cover 25 are provided in the four corners on the opening surface of the case body 24. When fitting the case body 24 with the cover 25 and the ECU 26, the outer surfaces in the cover 25 and the ECU 26 in positions corresponding to the guide 33B are in an abrading contact with the inner side surface of the guide 33B, so that the cover 25 and the ECU 26 are guided to their prescribed fitting positions. Additionally, after the case body 24 and the cover 25 were fitted, the ECU 26 may be fitted.

As shown in FIG. 5, the lower end of the cover 25 is bulging to the right direction in FIG. 5, forming a relay housing member 35 for housing a relay 34 (an example of heating components).

As shown in FIG. 5, a relay unit 41 including the relay 34 is attached to the lower end of the circuit board 12. The relay unit 41 is constituted by fitting a metallic bus bar 52 and the relays 34 (five in the present embodiment) in a frame 20 made of synthetic resin.

The bus bar 52 is made of a metallic plate material subjected to press-molding or forming. One end of the bus bar 52 is connected with the circuit board 12, and the other end thereof is, in a state fitted in the frame 20, connected with a lead terminal 49 in the relay 34.

As shown in FIGS. 5 and 7, the relay 34 is placed in the bottom of the case body 24. The relay 34 is provided in a posture so that the surface, from which the lead terminal 49 is protruding, is facing the side of the circuit board 12 (see FIG. 5).

On the inner wall surface of the cover 25, a pair of heat insulation walls 53 extending up and down in FIG. 3 are provided in a protruded manner to the side of the circuit board 12 (to the right front side in FIG. 3). The heat insulation walls 53 stand in a direction orthogonal to the plate surface of the circuit board 12, and are formed so as to extend in the up and down (vertical) direction. The region surrounded by the area between a pair of the heat insulation walls 53, the inner wall surface of the cover 25, and the plate surface of the circuit board 12 is an ascending flow path 54 in which air can ascend. In addition, the region surrounded by the wall surface in the heat insulation wall 53 that is on the opposite side of the ascending flow path 54, the inner wall surface of the cover 25, and the plate surface of the circuit board 12 is a descending flow path 55 in which air can descend. In the present embodiment, one ascending flow path 54 is formed near the center in the horizontal direction in FIG. 7, and the descending flow paths 55 are respectively formed on both the right and left sides of this ascending flow path 54.

As shown in FIG. 7, among the relays 34, the relays 34A in the second, the third, and the fourth from the left in FIG. 7 are arranged inside of the ascending flow path 54.

As shown in FIG. 7, a clearance is formed between the upper end of the heat insulation wall 53 and the upper wall of the cover 25, and becoming an upper communication opening 56 that interconnects the ascending flow path 54 and the descending flow path 55. In addition, a clearance is formed between the lower end of the heat insulation wall 53 and the lower wall of the cover 25, and becoming a lower communication opening 57 that interconnects the ascending flow path 54 and the descending flow path 55.

The upper wall of the cover 25 is a heat radiation wall section 58A for radiating heat of the air in the descending flow path 55 to the outside of the case 11. Additionally, both the right and left side walls of the cover 25 in FIG. 7 are heat radiation wall sections 58B for radiating heat of the air in the descending flow path 55 to the outside of the case 11.

The heat insulation wall 53 is formed integrally with the cover 25 by injection molding. The heat insulation wall 53 comprises a first wall 59 provided in the side of the ascending flow path 54 and a second wall 60 provided in the side of the descending flow path 55 with a spacing from the first wall 59. An air layer 61 is formed between the first wall 59 and the second wall 60. The first wall 59 and the second wall 60 are connected at both the upper and lower ends thereof through a connecting wall 62.

Next, working and effect of the present embodiment is described in reference to FIG. 7. Energizing the relay 34 causes the relay 34 to generate heat. Heat generated from the relay 34 is transmitted to the air in the vicinity of the relay 34. The temperature of the air, to which heat has been transmitted, rises, and the specific gravity of the same is lowered, thereby causing the air to ascend as shown with an arrow A. Then, the air ascends inside of the ascending flow path 54 as shown with an arrow B. As catching in the surrounding air, the ascending air generates an ascending air current inside of the ascending flow path 54. The air that has reached the upper end of the ascending flow path 54 then moves to the upper end of the descending flow path 55 through the upper communication opening 56 as shown with an arrow C.

Heat of the air that has moved to the upper end of the descending flow path 55 is then transmitted to the upper wall of the cover 25 as the heat radiation wall section 58A, and radiated from the upper wall of the cover 25 to the outside of the case. Then, the temperature of the air falls, causing the specific gravity of the same to be enlarged, and the air therefore descends in the descending flow path 55 as shown with an arrow D. As catching in the surrounding air, the descending air generates a descending air current inside of the descending flow path 55. Both the right and left side walls of the cover 25 in FIG. 7 are heat radiation wall sections 58B, and thus, heat is transmitted from the air descending in the descending flow path 55 to both the right and left walls of the cover 25 in FIG. 7, and then radiated to the outside of the case 11. This causes the temperature of the air to fall further.

The air that has moved to the lower end of the descending flow path 55 then flows into the ascending flow path 54 through the lower communication opening 57 as shown with an arrow E. The air that has reached the lower end of the descending flow path 55 has a lower temperature, for having radiated its heat to the outside of the case through the upper wall of the cover 25 and both the right and left walls of the cover 25 in FIG. 7. The air having a temperature, which has been decreased in this manner, contacts with the relay 34, causing heat generated from the relay 34 to be transmitted again to the air. The air, to which heat generated from the relay 34 has been transmitted, ascends again as shown with an arrow A.

As mentioned, according to the present embodiment, a natural air convection occurs inside of the case 11 in a path sequentially following: the relay 34 (the heating component), the ascending flow path 54, the upper communication opening 56, the descending flow path 55, the lower communication opening 57, the ascending flow path 54, the relay 34 (the heating component), and the ascending flow path 54. Accordingly, heat generated from the relay 34 is dispersed in the case 11 by the air circulating inside of the case 11. As a result, a large and local temperature rise inside of the case 11 can be suppressed even without an opening in the case 11 for introducing the external air. Particularly, a large and local temperature rise in the vicinity of the relay 34 as a heating component can be suppressed.

Additionally, in the present embodiment, the relays 34B arranged in both the right and left ends in FIG. 7 are arranged inside of the descending flow path 55. Therefore, it can also be understood that heat generated from the relays 34B causes an ascending air current to occur inside of the descending flow path 55. However, the air, to which heat generated from the relay 34B has been transmitted, is caught in the ascending air current generated due to the relay 34A placed inside of the ascending flow path 54, so as to ascend in the ascending flow path 54. As a result, the present embodiment suppresses the occurrence of an ascending air current in the descending flow path 55.

In addition, in the present embodiment, the heat insulation wall 53 divides the ascending flow path 54 and the descending flow path 55, so that heat transmission between the ascending flow path 54 and the descending flow path 55 can be suppressed. This can provide a temperature difference between the air flowing in the ascending flow path 54 and the air flowing in the descending flow path 55. Consequently, in the ascending flow path 54 provided with the relay 34, an ascending air current can be generated due to the air having a relatively high temperature, while in the descending flow path 55, a descending air current can be generated due to the air having a relatively low temperature.

Furthermore, the relay 34 is arranged in the bottom of the cover 25. This allows the temperature of the air in the lower position in the ascending flow path 54 to be brought up to a temperature higher than the air in the upper position. A flow rate of the ascending air current grows faster as the temperature difference between the up and down in the ascending flow path 54 increases, and therefore, the flow rate of the ascending air current in the ascending flow path 54 can be increased. Accordingly, the flow rate of the air convecting naturally in the case 11 can be increased, and thereby suppressing a large and local temperature rise inside of the case 11 even further.

In addition, a pair of the heat insulation walls 53 are provided in the case 11, and the region between the pair of heat insulation walls 53 is the ascending flow path 54, while the region surrounded by the wall surfaces in each of the heat insulation walls 53 that are not the ascending flow path 54 and the inner wall of the case 11 is the descending flow path 55.

Rectification effect of a pair of the heat insulation walls 53 can increase the flow rate of the natural air convection flowing in the ascending flow path 54 and the descending flow path 55. Accordingly, a large and local temperature rise inside of the case 11 can be suppressed further.

Additionally, the circuit board 12 mounted with the resistance 50 and the substrate mounting relay 51 is placed in a vertical disposition, in other words, in a posture so that the plate surface thereof is perpendicular. Also, the heat insulation walls 53 stand in a direction orthogonal to the plate surface of the circuit board 12, and are formed so as to extend in the up and down (vertical) direction. The ascending flow path 54 and the descending flow path 55 are formed in the region surrounded by the plate surface of the circuit board 12, the inner wall surface of the case 11, and the heat insulation walls 53.

Energizing the resistance 50 and the substrate mounting relay 51 mounted in the circuit board 12 causes heat to be generated from the resistance 50 and the substrate mounting relay 51. Since the circuit board 12 constitutes a part of the ascending flow path 54 and the descending flow path 55, heat generated from the resistance 50 and the substrate mounting relay 51 is transmitted to the circuit board 12, then to the air flowing in the ascending flow path 54 and the descending flow path 55, and then is dispersed inside of the case 11. This can suppress a local and large temperature rise in the circuit board 12.

And also, in the present embodiment, the heat insulation wall 53 comprises a first wall 59 provided in the side of the ascending flow path 54 and a second wall 60 provided in the side of the descending flow path 55 with a spacing from the first wall 59, and the air layer 61 is formed between the first wall 59 and the second wall 60.

With the above configuration, the first wall 59 provided in the side of the ascending flow path 54 and the second wall 60 provided in the side of the descending flow path 55 can be insulated from each other by the air layer 61 formed between the first wall 59 and the second wall 60. Accordingly, with a simple structure of providing a spacing between the first wall 59 and the second wall 60, the heat insulation wall 53 can be formed.

And, in the present embodiment, the heat insulation wall 53 is integrally formed with the cover 25. This can reduce the number of parts.

<Embodiment 2>

Figure 8:
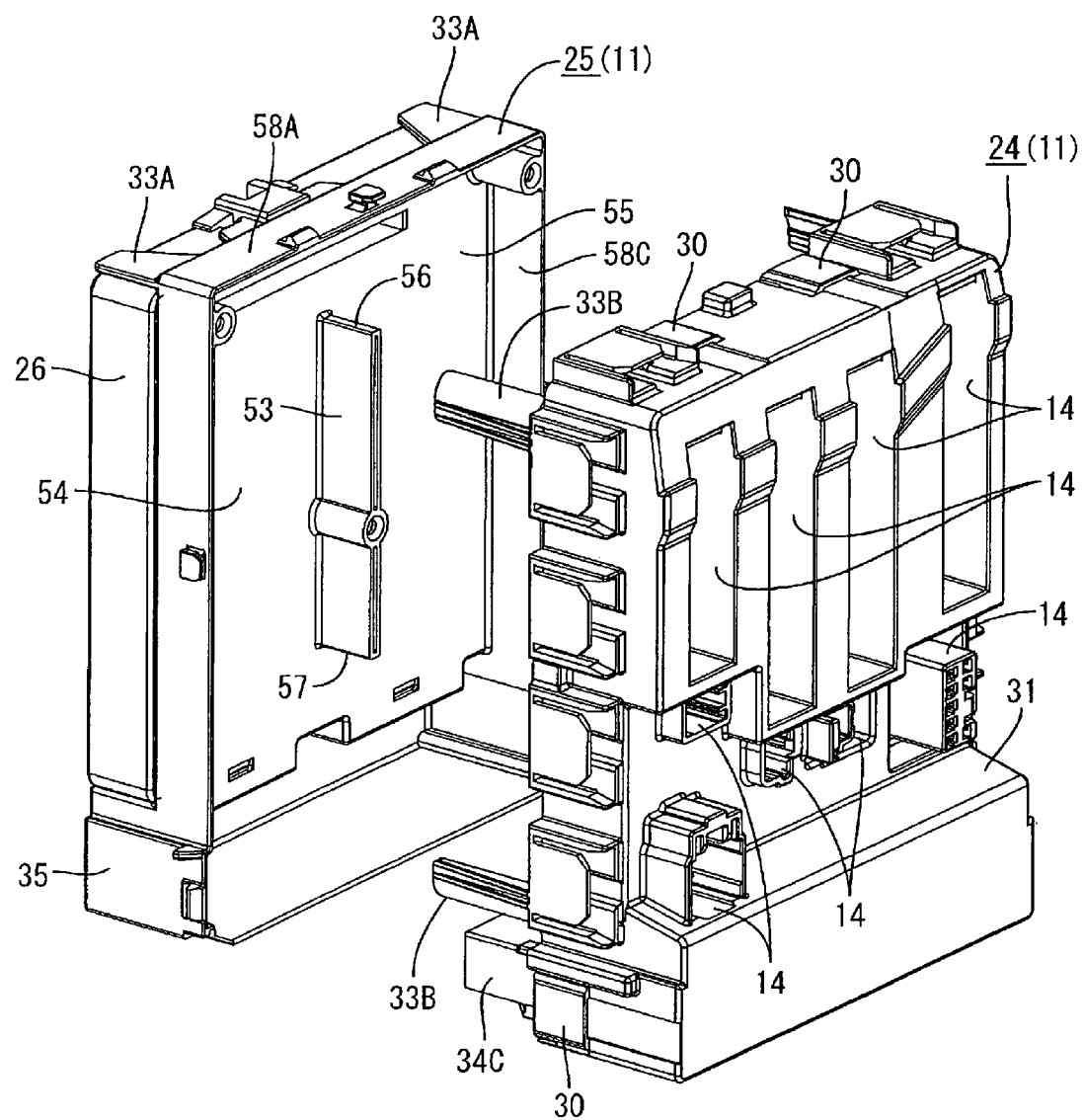
FIG. 8 is an exploded perspective view of a part of an electric connection box according to Embodiment 2.
Figure 9:
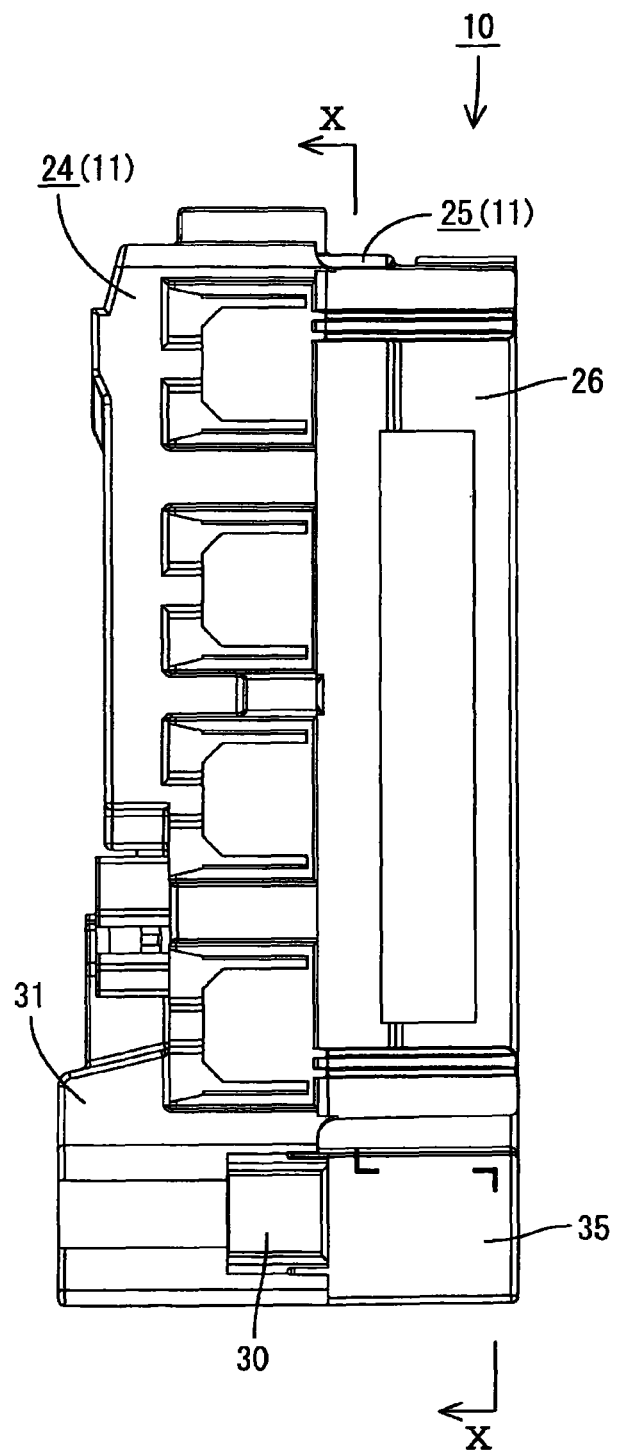
FIG. 9 is a side view of the electric connection box.
Figure 10:
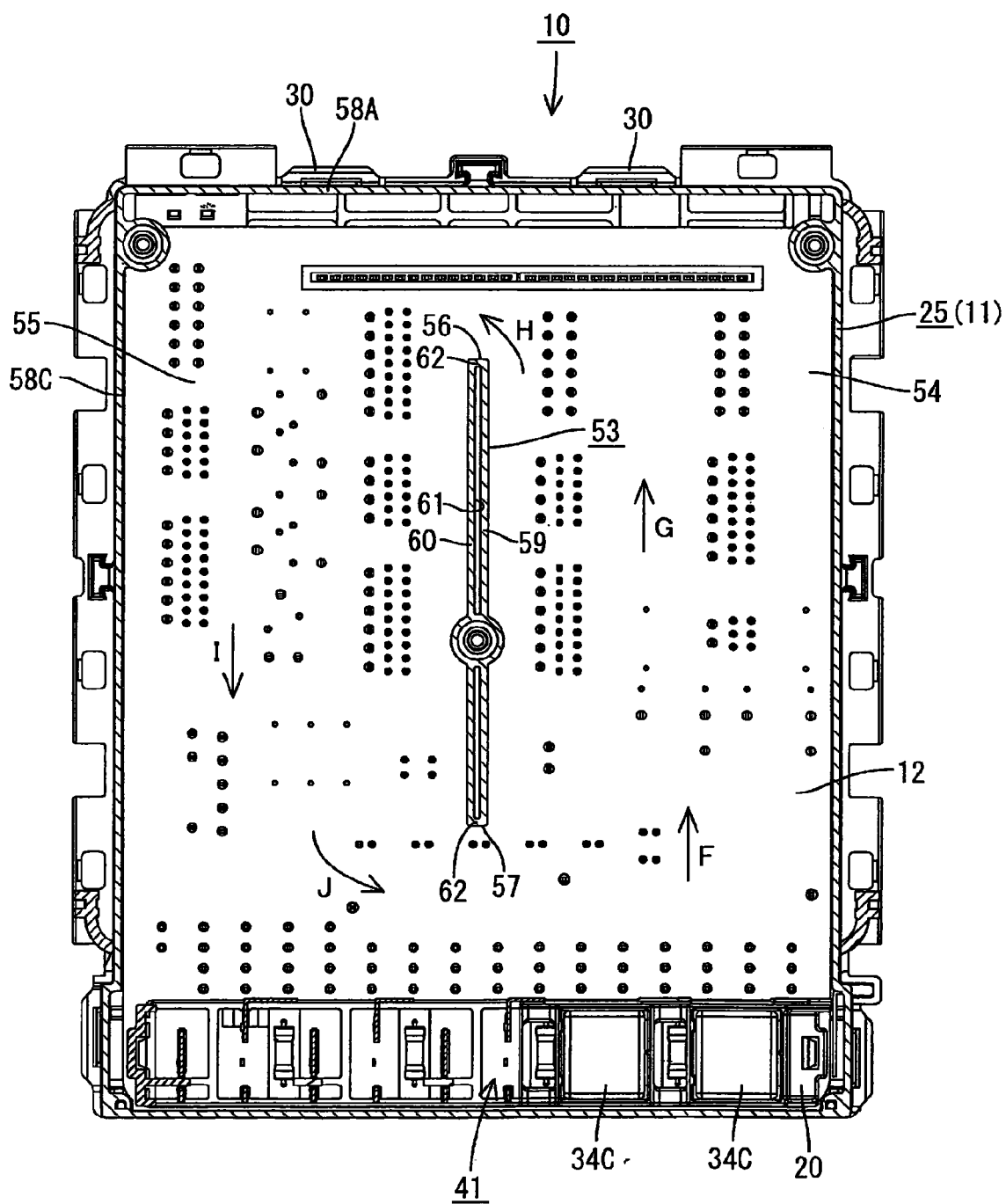
FIG. 10 is a cross-sectional view taken along a line X-X in FIG. 9.

Next, in reference to FIGS. 8 to 10, Embodiment 2 of the present invention is described. On the inner wall surface of the cover 25, one heat insulation wall 53 extending up and down in FIG. 8 is provided in a manner so as to protrude to the side of the circuit board 12 (the right front side in FIG. 8). As shown in FIG. 10, the region surrounded by the heat insulation wall 53, the inner wall surface of the right side wall of the cover 25 in FIG. 10, and the plate surface of the circuit board 12 is the ascending flow path 54 in which air can ascend. In addition, the region surrounded by the wall surface of the heat insulation wall 53 in the opposite side of the ascending flow path 54 (the left side wall surface in FIG. 10), the inner wall surface of the left side wall of the cover 25 in FIG. 10, and the plate surface of the circuit board 12 is the descending flow path 55 in which air can descend.

As shown in FIG. 10, in the present embodiment, two relays 34C are provided. The relays 34C are arranged in the bottom of the cover 25, which is inside of the ascending flow path 54. In addition, in the present embodiment, no relay 34C is provided in the descending flow path 55.

The configurations other than the above are nearly the same as Embodiment 1, and thus, the same numerals are allotted to the same members so as to omit repetitive descriptions thereof.

Next, working and effect of the present embodiment is described in reference to FIG. 10. Energizing the relay 34C causes the relay 34C to generate heat. Heat generated from the relay 34C is transmitted to the air in the vicinity of the relay 34C. The temperature of the air, to which heat has been transmitted, rises, and the specific gravity of the same is lowered, thereby causing the air to ascend as shown with an arrow F. Then, the air ascends inside of the ascending flow path 54 as shown with an arrow G. As catching in the surrounding air, the ascending air generates an ascending air current inside of the ascending flow path 54. The air that has reached the upper end of the ascending flow path 54 then moves to the upper end of the descending flow path 55 through the upper communication opening 56 as shown with an arrow H.

Heat of the air that has moved to the upper end of the descending flow path 55 is then transmitted to the upper wall of the cover 25 as the heat radiation wall section 58A, and radiated from the upper wall of the cover 25 to the outside of the case. Then, the temperature of the air falls, causing the specific gravity of the same to be enlarged, and the air therefore descends in the descending flow path 55 as shown with an arrow I. As catching in the surrounding air, the descending air generates a descending air current inside of the descending flow path 55. The left side wall of the cover 25 in FIG. 10 is the heat radiation wall section 58C, and thus, heat is transmitted from the air descending in the descending flow path 55 to the left wall of the cover 25 in FIG. 10, and then radiated to the outside of the case 11. This causes the temperature of the air to fall further.

The air that has moved to the lower end of the descending flow path 55 then flows into the ascending flow path 54 through the lower communication opening 57 as shown with an arrow J. The air that has reached the lower end of the descending flow path 55 has a lower temperature, for having radiated its heat to the outside of the case 11 through the upper wall of the cover 25 and the left wall of the cover 25 (the heat radiation wall section 58C) in FIG. 10. The air having a temperature, which has been decreased in this manner, contacts with the relay 34C, causing heat generated from the relay 34C to be transmitted again to the air. The air, to which heat generated from the relay 34C has been transmitted, ascends again as shown with an arrow F.

As mentioned, according to the present embodiment, a natural air convection occurs inside of the case 11 in a path sequentially following: the relay 34C, the ascending flow path 54, the upper communication opening 56, the descending flow path 55, the lower communication opening 57, the ascending flow path 54, the relay 34C, and the ascending flow path 54. Accordingly, heat generated from the relay 34C is dispersed in the case 11 by the air circulating inside of the case 11. As a result, a large and local temperature rise in the case 11 can be suppressed without an opening in the case 11 for introducing the external air. Particularly, a large and local temperature rise in the vicinity of the relay 34C as a heating component can be suppressed.

<Embodiment 3>

Figure 11:
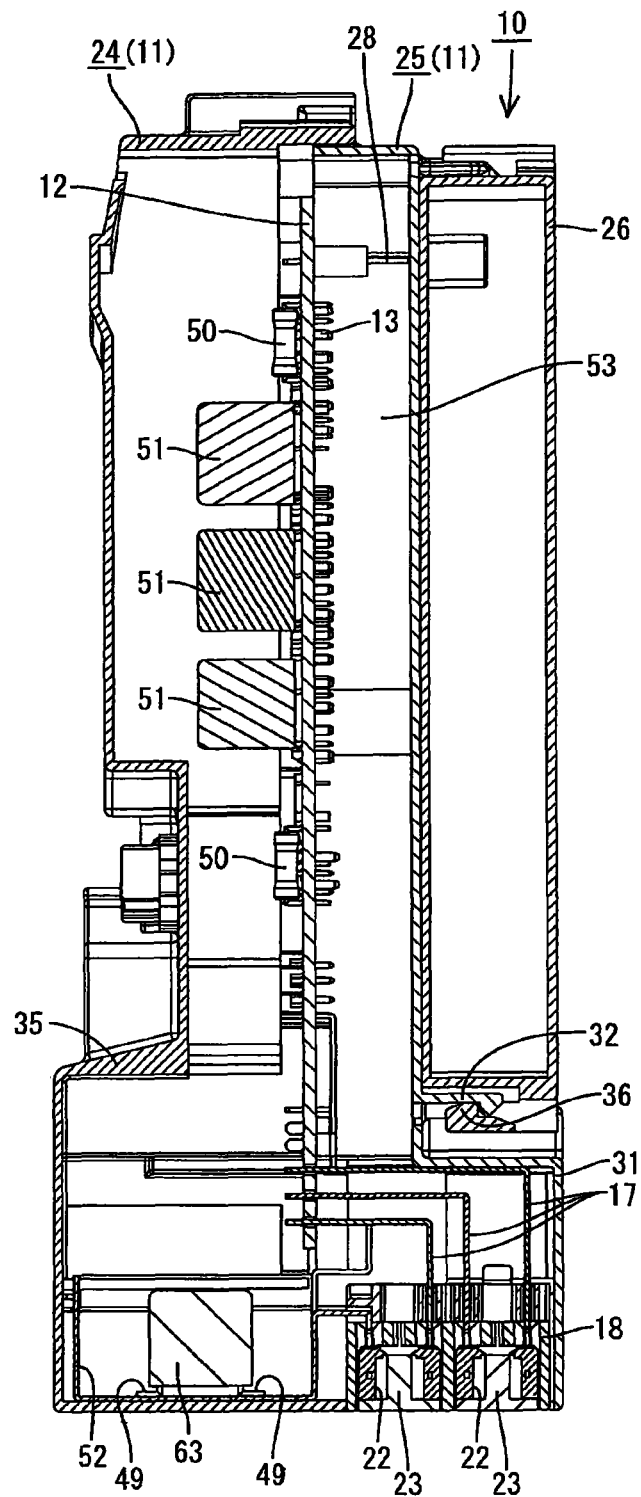
FIG. 11 is a cross-sectional view of an electric connection box according to Embodiment 3.

Next, in reference to FIG. 11, Embodiment 3 of the present invention is described. The lower end of the cover 25 is bulged out to the right in FIG. 11, and thus forms a fuse housing member 31 for housing the above-mentioned fuse block 18. The lower end of the fuse housing member 31 is opening downwardly, and the fuse block 18 is attached in this opening. As shown in FIG. 11, the lower opening edge of the fuse housing member 31 and the outer surface of the bottom of the fuse block 18 are nearly flush with each other.

Formed on the bottom surface of the fuse block 18 in FIG. 11 is a fuse attaching member 22 which is recessed upwardly. The fuse terminal 17 is positioned inside of this fuse attaching member 22. The fuse 23 (an example of heating components) is attached inside of the fuse attaching member 22, and connected with the fuse terminal 17.

The lower end of the case body 24 is bulging to the left direction in FIG. 11, forming a relay housing member 35 for housing a relay 63.

The circuit board 12 is connected with the bus bar 52. The bus bar 52 is bent and provided in a manner so as to follow the bottom wall of the relay housing member 35. The relay 63 is connected with the bus bar 52 in a posture so that the surface, from which the lead terminal 49 is protruding, is facing downward in FIG. 11.

The configurations other than the above are nearly the same as Embodiment 1, and thus, the same numerals are allotted to the same members so as to omit repetitive descriptions thereof.

In the present embodiment, a large and local temperature rise in the vicinity of the fuse 23 can be suppressed.

<Embodiment 4>

Figure 12:
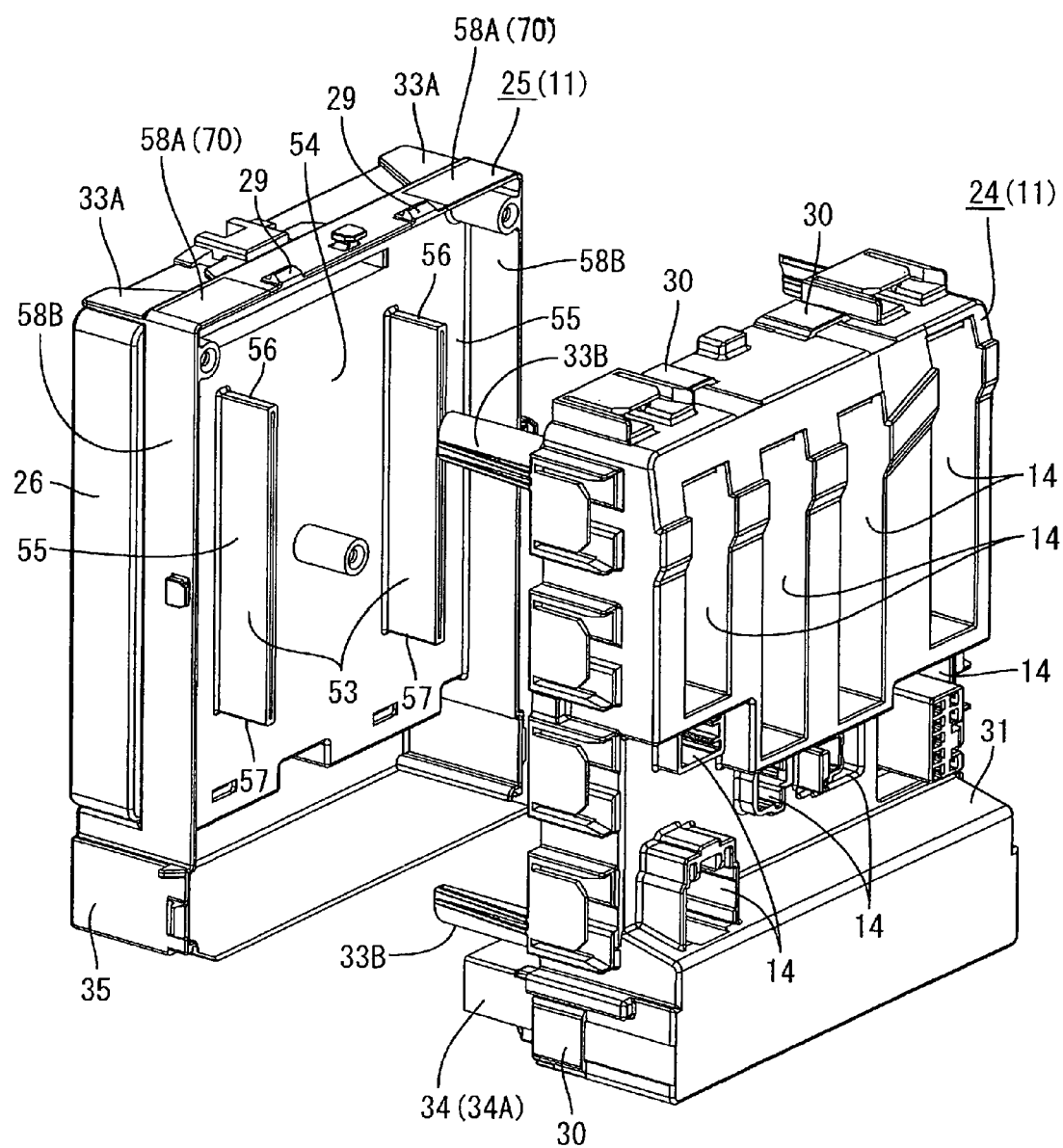
FIG. 12 is an exploded perspective view of a part of an electric connection box according to Embodiment 4.

Next, in reference to FIG. 12, Embodiment 4 of the present invention is described. Metallic heat radiation members 70 formed separately from the cover 25 are respectively fitted to the upper wall of the cover 25 at the end in the left front side and at the end in the right rear side in FIG. 12. The heat conductivity of the heat radiation member 70 made of metal is higher than that of the cover 25 made of synthetic resin. This heat radiation member 70 constitutes the heat radiation wall section 58A.

The configurations other than the above are nearly the same as Embodiment 1, and thus, the same numerals are allotted to the same members so as to omit repetitive descriptions thereof.

According to the present embodiment, the heat conductivity of the heat radiation wall section 58A can be enhanced, in comparison with the case of integrally forming the heat radiation wall section 58 with the cover 25. This allows heat of the air inside of the descending flow path 55 to be efficiently radiated to the outside of the case 11, and thereby improving the radiation performance of the electric connection box 10.

<Other Embodiments>

With embodiments of the present invention described above with reference to the accompanying drawings, it is to be understood that the invention is not limited to those precise embodiments, and the embodiments as below, for example, can be within the scope of the present invention.

(1) In the present embodiments, the heating component was the relay 34 or the fuse 23, however, the present invention is not limited to this, and the heating component may be a semiconductor relay.

(2) In the present embodiments, there is provided one or two heat insulation walls 53, however, the present invention is not limited to this, and there may be provided three or more heat insulation walls 53.

(3) When in the electric connection box 10 in which, for example, a circuit is constituted by providing the bus bar 52 on an insulating substrate, the circuit board 12 may be omitted:

(4) The heat insulation wall 53 may be formed separately from the case 11. In this case, the heat insulation wall 53 may be adhered to the case 11 by an adhesive, or be screwed with a bolt. Any mounting means may be employed for this assembly. And also, the heat insulation wall 53 may be mounted in the circuit board 12 by any mounting means like the above. The heat insulation wall 53 may be formed by using a heat insulator.

(5) In the present embodiments, the heat insulation wall 53 is constituted by providing the air layer 61 between the first wall 59 and the second wall 60, however, the present invention is not limited to this, and the heat insulation wall 53 may be constituted by filling the spacing between the first wall 59 and the second wall 60 with an heat insulator.

(6) The heating component may be placed in any positions when at least the position is inside of the ascending flow path 54.

(7) In Embodiment 4, the heat radiation members 70 are attached to the upper wall of the cover 25, however, the present invention is not limited to this, and the heat radiation members 70 may be attached to the side walls of the cover 25 so as to constitute the heat radiation wall sections 58B and 58C.

(8) In Embodiment 4, the heat radiation members 70 are metallic, however, the present invention is not limited to this, and the heat radiation members 70 may be formed by using any materials when at least they have a heat conductivity higher than the one of the material constituting the case 11.

The invention claimed is:

1. An electric connection box, comprising:
a case;
a heating component housed in the case; and
a heat insulation wall provided in a manner so as to extend vertically in the case, wherein,
in the case, between the heat insulation wall and the case, an ascending flow path where air ascends and a descending flow path where air descends are provided, an upper communication opening that connects between the ascending flow path and the descending flow path is arranged at the upper end of the heat insulation wall, a lower communication opening that connects between the ascending flow path and the descending flow path is arranged at the lower end of the heat insulation wall, and the heating component is placed inside of the ascending flow path, and
in the case, a heat radiation wall section for radiating heat of the air inside of the descending flow path to the outside of the case is provided in an region corresponding to the descending flow path.

2. The electric connection box according to claim 1, wherein the heat radiation wall section is formed separately from the case, and constituted by fitting a heat radiation member made of a material having a heat conductivity higher than that of the case to the case.

3. The electric connection box according to claim 2, wherein the heat insulation wall comprises a first wall positioned in the side of the ascending flow path and a second wall provided in the side of the descending flow path with a spacing from the first wall, and an air layer is formed between the first wall and the second wall.

4. The electric connection box according to claim 3, wherein the heat insulation wall is integrally formed with the case.

5. The electric connection box according claim 4, wherein the heating component is placed in the bottom of the case.

6. The electric connection box according to claim 5, wherein, in the case, a circuit board mounted with electronic components is arranged in an upright posture so that the plate face thereof is perpendicular, while also in the case, the heat insulation wall is provided in a manner so as to extend in a direction orthogonal to the plate face of the circuit board, so that the ascending flow path and the descending flow path are formed in a region surrounded by the plate face of the circuit board, an inner wall surface of the case, and the heat insulation wall.

7. The electric connection box according to claim 6, wherein the heating component is a relay.

8. The electric connection box according to claim 7, wherein the heating component is a fuse.

9. The electric connection box according to claim 8, wherein a pair of the heat insulation walls are provided in the case, and the region between the pair of heat insulation walls is the ascending flow path, while the region surrounded by the wall surfaces in each of the heat insulation walls that are not the ascending flow path and the inner wall of the case is the descending flow path.

10. The electric connection box according to claim 1, wherein the heat insulation wall comprises a first wall positioned in the side of the ascending flow path and a second wall provided in the side of the descending flow path with a spacing from the first wall, and an air layer is formed between the first wall and the second wall.

11. The electric connection box according to claim 1, wherein the heat insulation wall is integrally formed with the case.

12. The electric connection box according claim 1, wherein the heating component is placed in the bottom of the case.

13. The electric connection box according to claim 1, wherein, in the case, a circuit board mounted with electronic components is arranged in an upright posture so that the plate face thereof is perpendicular, while also in the case, the heat insulation wall is provided in a manner so as to extend in a direction orthogonal to the plate face of the circuit board, so that the ascending flow path and the descending flow path are formed in a region surrounded by the plate face of the circuit board, an inner wall surface of the case, and the heat insulation wall.

14. The electric connection box according to claim 1, wherein the heating component is a relay.

15. The electric connection box according to claim 1, wherein the heating component is a fuse.

16. The electric connection box according to claim 1, wherein a pair of the heat insulation walls are provided in the case, and a region between the pair of heat insulation walls is the ascending flow path, while a region between the inner wall of the case and the ascending flow path not including the heat insulation wall is the descending flow path.

* * * * *